United States Patent
Altmann et al.

(10) Patent No.: US 6,924,648 B2
(45) Date of Patent: Aug. 2, 2005

(54) METHOD FOR IDENTIFYING RISKS AS A RESULT OF STRAY CURRENTS

(75) Inventors: Martin Altmann, Erlangen (DE); Wolfgang Braun, Schesslitz (DE); Ulrich Halfmann, Bräuningshof (DE); Egid Schneider, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/638,359

(22) Filed: Aug. 12, 2003

(65) Prior Publication Data

US 2004/0104723 A1 Jun. 3, 2004

(30) Foreign Application Priority Data

Aug. 12, 2002 (DE) ......................................... 102 36 943

(51) Int. Cl.[7] .............................................. G01R 31/08
(52) U.S. Cl. ...................................... 324/522; 324/500
(58) Field of Search ................................. 324/512, 522, 324/537, 71.1, 71.2, 72, 73.1; 204/193, 400, 404

(56) References Cited

U.S. PATENT DOCUMENTS

| | | | | |
|---|---|---|---|---|
| 4,003,815 A | * | 1/1977 | Ikeda et al. .................. | 204/404 |
| 4,882,542 A | * | 11/1989 | Vail, III ....................... | 324/368 |

FOREIGN PATENT DOCUMENTS

| | | |
|---|---|---|
| DE | 43 32 888 C2 | 3/1995 |
| EP | 0 833 423 A2 | 4/1998 |
| WO | WO 95/08453 | 3/1995 |

OTHER PUBLICATIONS

Egid Schneider et al., "Bahnrückstromführung und Erdung bei Bahnanlagen, Teil 3: Gleichstrombahnen", pp. 99–106, Apr. 1998.

Mercury Instruments Limited, "Stray Current Monitoring on D.C. Electrified Lines", Application Note, No. 8, XP–002261462. May 2000.

Dev Paul, "DC Traction Power System Grounding", pp. 2133–2139. 2001, no month available.

2001 IEEE/ASME Joint Rail Conference, Apr. 17–Apr. 19, 2001, Analysis of Stray Current, Track–to–Earth Potentials & Substation Negative Grounding in DC Traction Electrification System, pp. 141–160.

* cited by examiner

*Primary Examiner*—Vincent Q. Nguyen
(74) *Attorney, Agent, or Firm*—Harness, Dickey & Pierce, P.L.C.

(57) ABSTRACT

A method is for identifying risks as a result of stray currents which flow to ground from a rail which returns a traction current in a track with a DC power supply. In accordance with a first embodiment, in which the voltage between the rail and ground is measured and an increased risk as a result of stray currents is indicated if there is a discrepancy from a voltage reference value, provision is made for the voltage to be measured at a plurality of measurement points along the track and for the measurements to be evaluated in an evaluation center. In accordance with a second embodiment, provision is made for activating a short-circuiter to connect a parallel path to the rail for returning the traction current. The current level in the parallel path is then measured and an increased risk as a result of stray currents is indicated if there is a discrepancy from a current-level reference value. Further, the method includes joint evaluation of a plurality of measurements which have been ascertained along the track.

33 Claims, 1 Drawing Sheet

METHOD FOR IDENTIFYING RISKS AS A RESULT OF STRAY CURRENTS

The present application hereby claims priority under 35 U.S.C. §119 on German patent application number DE 10236943.7 filed Aug. 12, 2002, the entire contents of which are hereby incorporated herein by reference.

FIELD OF THE INVENTION

The invention generally relates to a method for identifying risks as a result of stray currents.

BACKGROUND OF THE INVENTION

Stray currents flow to the ground (into the soil of the earth) from a rail which returns traction current in a track with a DC power supply.

Normally, the rails in DC railways are used to return current. The rails are therefore insulated from the ground. This is because no current is intended to flow from the rails through the ground into surrounding conducting structures. Such structures can be parts of building foundations or tunnel systems, or else pipeline systems. The flow of current can result in corrosion of these structures, for example, if they are made of metal.

The insulation between the rails and ground can become damaged or electrically bridged in another way over the course of time, however. Thus, stray currents could flow to ground and to the structures which are at risk.

In order to be able to identify such stray current effects, proposals have already been made to install "reference electrodes" along the track. Such an electrode measures the potential in the ground below the rail. Installing such electrodes is highly involved. In addition, evaluating the measurements from the electrodes is complicated and expensive.

Proposals have also already been made to discharge possible stray currents using special devices, for example using drainage diodes, and to indicate this current if required. Such designs result in a lasting increase in the stray currents.

Proposals have also already been made to measure the voltage between the rail and the ground at a point and to indicate an increased risk as a result of stray currents if there is a discrepancy from a voltage reference value.

SUMMARY OF THE INVENTION

An embodiment of the invention is based on an object of specifying a simple and reliable method for identifying stray current risks which delivers easily evaluated measurements and does not require any complex devices and does not result in a lasting increase in the stray currents.

DETAILED DESCRIPTION OF THE PREFERRED EMBODIMENTS

Figure 1:
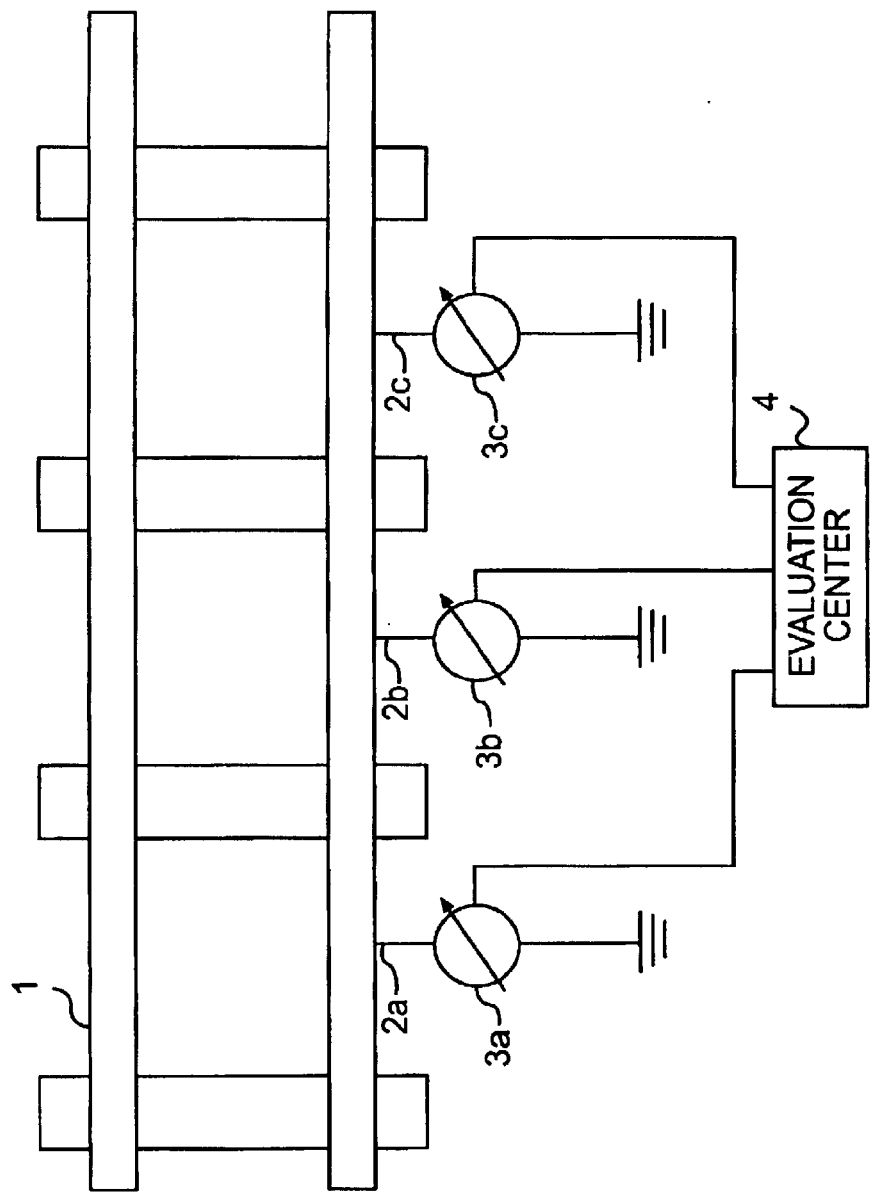
FIG. 1 illustrates embodiment shown reference values established at points on a rail or track.

In accordance with a first embodiment, in which the voltage between the rail 1 and the ground is measured and an increased risk as a result of stray currents is indicated if there is a discrepancy from a voltage reference value, an object may be achieved by virtue of the voltage being measured at a plurality of measurement points 2a, 2b, 2c along the track and by virtue of the measurements being transmitted to an evaluation center 4 where they are evaluated centrally.

An advantage attained is that a plurality of simple voltage measurements suffice in order to obtain a reliable statement about the risk. These voltage measurements can be ascertained at a plurality of measurement points 2a, 2b, 2c using simple voltage measuring instruments 3a, 3b, 3c and are easy to evaluate in an evaluation unit 4. This involves a comparison with reference values.

In accordance with a second embodiment, an object may be achieved by virtue of activating a short-circuiter connecting a parallel path to the rail 1 for returning the traction current, by virtue of the current level in the parallel path being measured, and by virtue of an increased risk as a result of stray currents being indicated if there is a discrepancy from a current-level reference value.

Such a parallel path is a continuous tunnel reinforcement, for example. The parallel path is connected when required using a short-circuiter.

The second embodiment of the method in accordance with the invention involves the insight that current-level measurement in the parallel path can indicate damage to the insulation between the rail 1 and ground. This is because damage to this insulation reduces the electrical resistance of the rail 1 with respect to ground. Thus, a larger current is drained at that point. Since the electrical resistance of the parallel path remains the same, the current level in the parallel path increases on account of the damage to the insulation.

An advantage attained is that simple current-level measurements are sufficient to obtain a reliable statement about the risk. Simple current measuring instruments are adequate. The second embodiment also involves the measurement being compared with a reference value for evaluation purposes.

Both illustrated methods in accordance with an embodiment of the invention attain the advantage that risks as a result of stray currents can be identified quickly and reliably using simple technical devices. It is possible to avoid any risk to structures in the ground as a result of stray currents by taking suitable measures at an early point in time.

In the case of the second embodiment of the method, the current level may be measured at a plurality of measurement points 2a, 2b, 2c along the track, for example, and the measurements are then evaluated centrally. This attains the advantage that pinpointing is a simple matter.

By way of example, the voltage or current-level reference value may be ascertained for an as-new track and over a period with a known train sequence. The subsequent measurements are then taken over a period of largely the same length with largely the same train sequence. This period can be one week in length, for example.

A flow of current in the rails exists only when trains are traveling over the track. The current level of the return current in the rail 1 depends on the number of trains traveling on the track and on how far away the individual trains are from the measurement point at the time of the measurement (train sequence). It is therefore useful to average both the reference values and the subsequent measurements over a prescribed period of equal length, and additionally the number of trains traveling on the track in this period should be as equal as possible.

By way of example, the measurements from adjacent measurement points are evaluated together. This can be done by adding the measurements. This reduces the influence of individual incorrect measurements. Overall analysis for an improved check is possible.

An increased risk is indicated, by way of example, for the section of track between adjacent measurement points which together have the greatest discrepancy from the reference value. A location at which disturbing stray currents arise can thus be indicated quickly and reliably in order to be able to check the insulation between the rail 1 and ground at this point in situ if appropriate.

It is also possible to indicate, by way of example, that the location with the greatest risk is close to the measurement point which delivers the lowest measurement for the voltage or the highest measurement for the current level. This allows even better localization.

By way of example, the measurements from the individual measurement points 2a, 2b, 2c along the track are transmitted to an evaluation center 4 using a communications system. This can take place in intervals of one second, for example.

By way of example, a risk is indicated if there is a discrepancy from the reference value of at least 50% over a period comprising a plurality of days in succession. This period is five days, for example. Brief extraordinary measurements thus do not result in any indication of risk.

By way of example, the possibility of a risk is indicated if there is a discrepancy from the reference value of between 10% and 50%. An indication is thus given of a location at which a risk might arise. This location can then be given particular attention.

By way of example, the presence of a risk is indicated if the possibility of a risk is indicated without interruption for at least one week, e.g. over ten days. A discrepancy from the reference value of between 10% and 50%, for example, over a relatively long period is thus regarded as a risk in the same way as a greater but shorter discrepancy.

The method in accordance with an embodiment of the invention attains the particular advantage that risks as a result of stray currents which can come from the rails in a DC railway can be both identified and, if appropriate, pinpointed quickly and reliably using simple devices. Identification and/or pinpointing for a voltage measurement always takes place in a central evaluation unit. For a current-level measurement, identification and/or pinpointing can usefully take place either in a central evaluation unit or locally and automatically.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for identifying risks as a result of stray currents which flow to ground from a rail which returns traction current in a track with a DC power supply, comprising:
    measuring a voltage between the rail and the ground;
    indicating a relatively increased risk as a result of stray currents upon the measured voltage indicating a discrepancy from a voltage reference value, wherein the voltage is measured at a plurality of measurement points along the track; and transmitting the measurements to an evaluation center where they are evaluated centrally, wherein
        the reference value is ascertained for a new track and over a period with a known train sequence, and wherein
        the subsequent measurements are taken over a period of largely the same length with largely the same train sequence.

2. The method as claimed in claim 1, wherein the measurements from adjacent measurement points are evaluated together.

3. The method as claimed in claim 1, wherein a relatively increased risk is indicated for the section of track between adjacent measurement points having a relatively greatest discrepancy from the reference value.

4. The method as claimed in claim 1, wherein the location with the relatively greatest risk is indicated as being at least close to the measurement point which delivers the relatively lowest measurement for the voltage.

5. The method as claimed in claim 1, wherein the measurements are transmitted to an evaluation center using a communications system.

6. The method of claim 5, wherein the measurements are transmitted in one second intervals.

7. A method for identifying risks as a result of stray currents which flow to ground from a rail which returns the traction current in a track with a DC power supply, comprising:
    activating a short-circulator to connect a parallel path to the rail for returning the traction current;
    measuring a current level in the parallel path; and
    indicating a relatively increased risk as a result of stray currents upon the measured current level indicating a discrepancy from a current-level reference value, wherein
        the reference value is ascertained for a new track and over a period with a known train sequence, and wherein
        the current level is measured over a period of largely the same length with largely the same train sequence.

8. The method as claimed in claim 7, wherein the current level is measured at a plurality of measurement points along the track and wherein the measurements are evaluated centrally.

9. The method as claimed in claim 8, wherein the measurements from adjacent measurement points are evaluated together.

10. The method as claimed in claim 7, wherein a relatively increased risk is indicated for the section of track between adjacent measurement points having a relatively greatest discrepancy from the reference value.

11. The method as claimed in claim 7, wherein the location with the relatively greatest risk is indicated as being at least close to the measurement point which delivers the relatively highest measurement for the current level.

12. The method as claimed in claim 7, wherein the measurements are transmitted to an evaluation center using a communications system.

13. A method, comprising:
    measuring a voltage between a rail and the ground at a plurality of points;
    transmitting the measurements; and
    determining a risk of stray currents from the rail, upon the transmitted measurements indicating a measured voltage differing from a voltage reference value ascertained for a new track and over a period with a known train sequence, and wherein
        the measurements are taken over a period of largely the same length with largely the same train sequence.

14. The method of claim 13, wherein the method is for determining a risk as a result of stray currents which flow to the ground from a rail which returns traction current in a track with a DC power supply.

15. The method of claim 13, wherein the measurements from the plurality of points along the track are transmitted to an evaluation center using a communications system.

16. The method of claim 15, wherein the measurements are transmitted in one second intervals.

17. The method of claim 13, wherein a risk of stray currents is determined upon the measured voltage differing from the voltage reference value by at least 50%.

18. The method of claim 13, wherein a risk of stray currents is determined upon the measured voltage differing from the voltage reference value by at least 50% over a period of a plurality of days in succession.

19. The method of claim 13, wherein a risk of stray currents is determined upon the measured voltage differing from the voltage reference value over a period of a plurality of days in succession.

20. The method of claim 13, wherein a risk of stray currents is determined upon the measured voltage differing from the voltage reference value by at least between 10% and 50%.

21. The method of claim 13, wherein a risk of stray currents is determined upon the measured voltage differing from the voltage reference value by at least between 10% and 50% over a period of a plurality of days in succession.

22. The method of claim 13, wherein the measurements are transmitted to a relatively centrally located evaluation center for evaluation.

23. A method, comprising:
   connecting a parallel path to a rail for returning traction current;
   measuring a current level in the parallel path; and
   determining a risk of stray currents from the rail upon the measured current level differing from a current-level reference value ascertained for a new track and over a period with a known train sequence, and wherein
      the current level is measured over a period of largely the same length with largely the same train sequence.

24. The method of claim 23, wherein the method is for determining a risk as a result of stray currents which flow to the ground from a rail which returns traction current in a track with a DC power supply.

25. The method of claim 24, wherein a short-circuiter is activated to connect the parallel path to the rail.

26. The method of claim 23, wherein a short-circuiter is activated to connect the parallel path to the rail.

27. The method of claim 23, wherein a risk of stray currents is determined upon the measured current level differing from a current-level reference value by at least 50%.

28. The method of claim 23, wherein a risk of stray currents is determined upon the measured current level differing from a current-level reference value by at least 50% over a period of a plurality of days in succession.

29. The method of claim 23, wherein a risk of stray currents is determined upon the measured current level differing from a current-level reference value over a period of a plurality of days in succession.

30. The method of claim 23, wherein a risk of stray currents is determined upon the measured current level differing from a current-level reference value by at least between 10% and 50%.

31. The method of claim 23, wherein a risk of stray currents is determined upon the measured current level differing from a current-level reference value by at least between 10% and 50% over a period of a plurality of days in succession.

32. The method of claim 23, wherein measurements from a plurality of points along the track are transmitted to an evaluation center using a communications system.

33. The method of claim 32, wherein the measurements are transmitted in one second intervals.

* * * * *